(12) United States Patent
Yu et al.

(10) Patent No.: US 11,043,911 B2
(45) Date of Patent: Jun. 22, 2021

(54) MOTOR CONTROL DEVICE WITH BUILT-IN CURRENT SENSING RESISTOR AND POWER TRANSISTOR

(71) Applicants: ICP Technology Co., Ltd., Taoyuan (TW); Sentec E&E Co., Ltd., Taoyuan (TW)

(72) Inventors: Ho-Chieh Yu, Taoyuan (TW); Chen-Cheng-Lung Liao, Taoyuan (TW); Chun-Yu Lin, Taoyuan (TW); Jason An Cheng Huang, Taoyuan (TW)

(73) Assignees: ICP Technology Co., Ltd., Taoyuan (TW); Sentec E&E Co., Ltd., Taoyuan (TW)

( * ) Notice: Subject to any disclaimer, the term of this patent is extended or adjusted under 35 U.S.C. 154(b) by 40 days.

(21) Appl. No.: 16/692,279

(22) Filed: Nov. 22, 2019

(65) Prior Publication Data
US 2020/0186067 A1    Jun. 11, 2020

(30) Foreign Application Priority Data
Dec. 7, 2018 (TW) ................. 107144172

(51) Int. Cl.
*H02P 7/298* (2016.01)
*H02P 6/12* (2006.01)
*H03K 17/56* (2006.01)

(52) U.S. Cl.
CPC .............. *H02P 7/2985* (2013.01); *H02P 6/12* (2013.01); *H03K 17/56* (2013.01)

(58) Field of Classification Search
CPC .................. H02P 7/2985; H02P 6/12
USPC ............................................ 318/3, 4, 5
See application file for complete search history.

(56) References Cited

U.S. PATENT DOCUMENTS 10,192,818 B2 * 1/2019 Simakawa .............. H01L 23/12

* cited by examiner

*Primary Examiner* — David Luo
(74) *Attorney, Agent, or Firm* — Wang Law Firm, Inc.

(57) ABSTRACT

A motor control device with built-in shunt resistor and power transistor is disclosed, comprising a high-thermally conductive substrate; an electrically conductive circuit which is thermo-conductively installed on the high-thermally conductive substrate and includes a first thermal connection pad portion and a second thermal connection pad portion mutually spaced apart; a high power transistor conductively connected to the electrical conducive circuit; and a shunt resistor conductively connected to the high power transistor, respectively including a body whose thermal expansion coefficient is greater than that of the high-thermally conductive substrate, as well as a pair of welding portions extending from the body, in which the body has a prescribed width, and the width of the welding portion is greater than the prescribed width, and the body and the high-thermally conductive substrate are spaced apart such that, upon welding the welding portion to the first thermal connection pad portion and the second thermal connection pad portion, the thermal expansion stress occurring between the body and the high-thermally conductive substrate can be distributed and undertaken in the width direction.

8 Claims, 8 Drawing Sheets

MOTOR CONTROL DEVICE WITH BUILT-IN CURRENT SENSING RESISTOR AND POWER TRANSISTOR

FIELD OF THE INVENTION

The present invention relates to a control device; in particular, it relates to a type of control device with built-in shunt resistor and high power consumption component, in which the high power consumption component may be a high power transistor.

BACKGROUND OF THE INVENTION

In recent years, due to the gradual depletion of petrochemical energy sources and environmental pollution, the use of green energy vehicles has become a new favorite in the market, the purpose is certainly to, on the one hand, save energy, and at the same time, the pollution issue may be partially resolved. Through the continuous improvements in terms of motor torque, rotation speed and other items, it has successfully developed various new types of cars, including hybrid electric vehicles (HEV), pure electric vehicles or electric motor vehicles and so forth.

Generally, for a vehicle having a motor as its power source, the fundamental structure thereof may be configured with a power/generator motor, a high-voltage power storage device, and a motor control device for performing high/low voltage or AC-DC conversion processes. The motor control device can convert the current sent by the high-voltage power storage device into the current conforming to the power distribution specification of the motor, so that the motor can operate and drive the vehicle to move forward, and, while the motor generates and outputs the current, the current can be converted into a corresponding voltage for storage to the high-voltage power storage device.

It should be noticed that, in electric vehicles, whether it is used to drive a motor or stored in a high-voltage power storage device, the current is typically at least tens of amps, and sometimes can even reach as high as several hundreds or thousands of amps; therefore, those skilled ones in the art can easily understand that adding a shunt resistor to the motor control device is a commonly applied solution for monitoring the transmission current variations, which not only protects the motor and the high-voltage power storage device, but more importantly, this allows to reduce the possibility of accidents. However, with respect to the currently available shunt resistors, there still exist some challenging problems in combining with the motor control device, especially in case that large current flows through the shunt resistor, which may cause the high heat generation problem.

For example, FIG. 1 shows a motor control device, in which the shunt resistor 9 has two conductive connection ends, one of which is connected to an existing wire 91, and fixedly locked by a bolt 92 to the input port 93 of the motor control device. However, the location where the bolt 92 is locked will inevitably result in uneven distribution of application force at that joint point, which probably leads to some issues like uneven fittings, leaving some unwanted air in the gap, even excessive force causing some deformation or undesirably increased resistance. Hence, in case of continuous large current transmissions, the joint portions conjunctively having some gaps will cause the heat generated based on the square of the current due to the slight rise of the resistance therein, which may unnecessarily consumes more power, and especially such generated high temperature may cause higher resistances and lead to component aging problems for all surrounding components, where the thermal resistance will further adversely affect the monitoring results, and component aging will reduce the service lifespan of the overall circuit equipment.

Moreover, since the vehicle continuously generates vibration during driving, this will greatly increase the probability of the bolt loosening, and the gap of the current-sense resistor connecting the electric wire may be enlarged, accordingly, the resistance and thermal resistance issues may potentially become more serious. Because this type of structural design is characterized in externally connecting to the motor control circuit, only a minor part of the overall heat dissipation is transmitted through the bolts and the wires, but mostly depending on the surrounding air convection, which makes the sizes of conventional shunt resistors inevitably become quite large, such as 2×8 $cm^2$.

In addition, there is a motor control device designed to increase the heat-sinking efficiency of the shunt resistor, which reduces the size of the shunt resistor and embeds it onto the high-thermally conductive substrate of the motor control device. As shown in FIG. 2, the shunt resistor 8 is adhered to the high-thermally conductive substrate 82 by a kind of thermally conductive resin layer 81 (Epoxy), and the wire 83 extends from both ends of the shunt resistor 8 to the shunt device, but in response to the placement modification and volume miniaturization, certain negative effects may also arise, mainly with respect to temperature increase. When the shunt resistor itself is reduced in size, the cross-section width of the electron channel will becomes greatly reduced, the current density is increased, and thus the operating temperature also rises up. What makes the situation worse is, because the original shunt resistor has a longer width, e.g., of several centimeters, the available area of the hole for the screw contact can be at least 1 to 4 square centimeters; however, after the above-said miniaturization, for adhering to the high-thermally conductive substrate with the thermo-conductive adhesive, the contact area of the thermal conduction becomes merely tens square millimeters, indicating that the heat conduction area is largely reduced, so it is certainly impossible to cope with the greatly increased heat density in this way. Furthermore, even though the thermal adhesive enables heat conduction feature, its actual thermal conductivity is much lower than that of metal, which makes the heat-generating density in the shunt resistor increase, the heat transfer area is reduced, the heat resistance of the heat-transfer path may be elevated, and the heat energy transmitted to the high-thermally conductive substrate is hindered, so that most of the heat energy adversely accumulates in the shunt resistor and heat dissipations become harder, which is also one of the issues the present invention intends to address.

In summary, the present invention is expected to smoothly mount the shunt resistor to existing high-thermally conductive substrates, such that, on the one hand, it can be combined in a simple manner, and the bonding relationship can be ensured to be stable, and the bridge structure is applied to make the thermal resistance significantly lower thereby also reducing the impact of vibration at the same time; especially, it is to expand the contact area, and completely avoid the problem of residual air gap at the contact position, so that the heat can be carried away by means of the convective air, and the rest can be smoothly guided to the high-thermally conductivity substrate in order to reduce the temperature in the shunt resistor as well as thermal interference to the surrounding areas.

SUMMARY OF THE INVENTION

An objective of the present invention is to provide a motor control device with built-in shunt resistor and power transistor, so that the miniaturization of the shunt resistor becomes feasible, and the heat dissipation efficiency can be improved through the surface-mount welding of the enlarged area.

Another objective of the present invention is to provide a motor control device with built-in shunt resistor and power transistor, so that the stability and thermal conductivity in the combination of the shunt resistor and the thermally conductive substrate can be significantly improved by means of surface mount bonding method.

Yet another objective of the present invention is to provide a motor control device with built-in shunt resistor and power transistor, so that the influence of thermal expansion stresses can be effectively reduced by means of larger welding portion areas and an additional elevated structure.

Also yet another objective of the present invention is to provide a motor control device with built-in shunt resistor and power transistor, so that the original high-thermally conductive substrate and peripheral heat-sinking equipments can be effectively utilized by means of the good heat conduction design thereby allowing the shunt resistor to operate in an environment of appropriate temperature ranges.

The motor control device with built-in shunt resistor and power transistor comprises: a substrate; at least one electrically conductive circuit which is thermo-conductively installed on the high-thermally conductive substrate and includes at least one first thermal connection pad portion and a second thermal connection pad portion mutually spaced apart; at least one high power consumption component characterized in operation state variations due to current changes, which is installed on the electrically conductive circuit; and, at least one shunt resistor conductively connected to the high power consumption component, in which the shunt resistor respectively includes a body whose thermal expansion coefficient is greater than that of the substrate, as well as a pair of welding portions extending outwards individually along the mutually opposite directions from the body, and wherein the body has a prescribed width, and the width of the welding portion is not smaller than the prescribed width, and the body and the high-thermally conductive substrate are spaced apart such that, upon welding the welding portion to the first thermal connection pad portion and the second thermal connection pad portion, the thermal expansion stress occurring between the body and the high-thermally conductive substrate can be distributed and undertaken in the width direction between the welding portion and the first thermal connection pad portion and the second thermal connection pad portion.

Furthermore, by applying the aforementioned control device to the vehicle motor, it is possible to acquire a motor control device with built-in shunt resistor and power transistor, comprising: a high-thermally conductive substrate, whose heat transfer coefficient is at least greater than 10 W/m·k, and coefficient of thermal expansion at least smaller than $10 \times 10^{-6}$/K; at least one electrically conductive circuit which is thermo-conductively installed on the high-thermally conductive substrate and includes at least one first thermal connection pad portion and a second thermal connection pad portion mutually spaced apart; at least one high power transistor conductively connected to the electrical conductive circuit; and, at least one shunt resistor conductively connected to the high power transistor, in which the shunt resistor respectively includes a body, as well as a pair of welding portions extending outwards individually along the mutually opposite directions from the body, and wherein the body has a prescribed width, and the width of the welding portion is not smaller than the prescribed width, and the body and the high-thermally conductive substrate are spaced apart such that, upon welding the welding portion to the first thermal connection pad portion and the second thermal connection pad portion, the thermal expansion stress occurring between the body and the high-thermally conductive substrate can be distributed and undertaken in the width direction between the welding portion and the first thermal connection pad portion and the second thermal connection pad portion.

Through the above-said disclosure, it can be appreciated that the motor control device with built-in shunt resistor and power transistor according to the present invention allows manufacturing the shunt resistor into a surface mounting component of several millimeters for successful device miniaturization and can utilize common surface mounting processes to solder onto the electrical conductive circuit. In addition, the structural design of the elevated portion provides effective cushioning, thus reducing the effects caused by thermal expansion stresses and improving the bonding stability and reliability. Particularly, the enlarged welded area can improve the heat dissipation performance, and the heat energy can be instantly released to effectively reduce the energy accumulation, thereby enhancing the safety of use.

DETAILED DESCRIPTION OF THE ILLUSTRATED EMBODIMENTS

Figure 1:
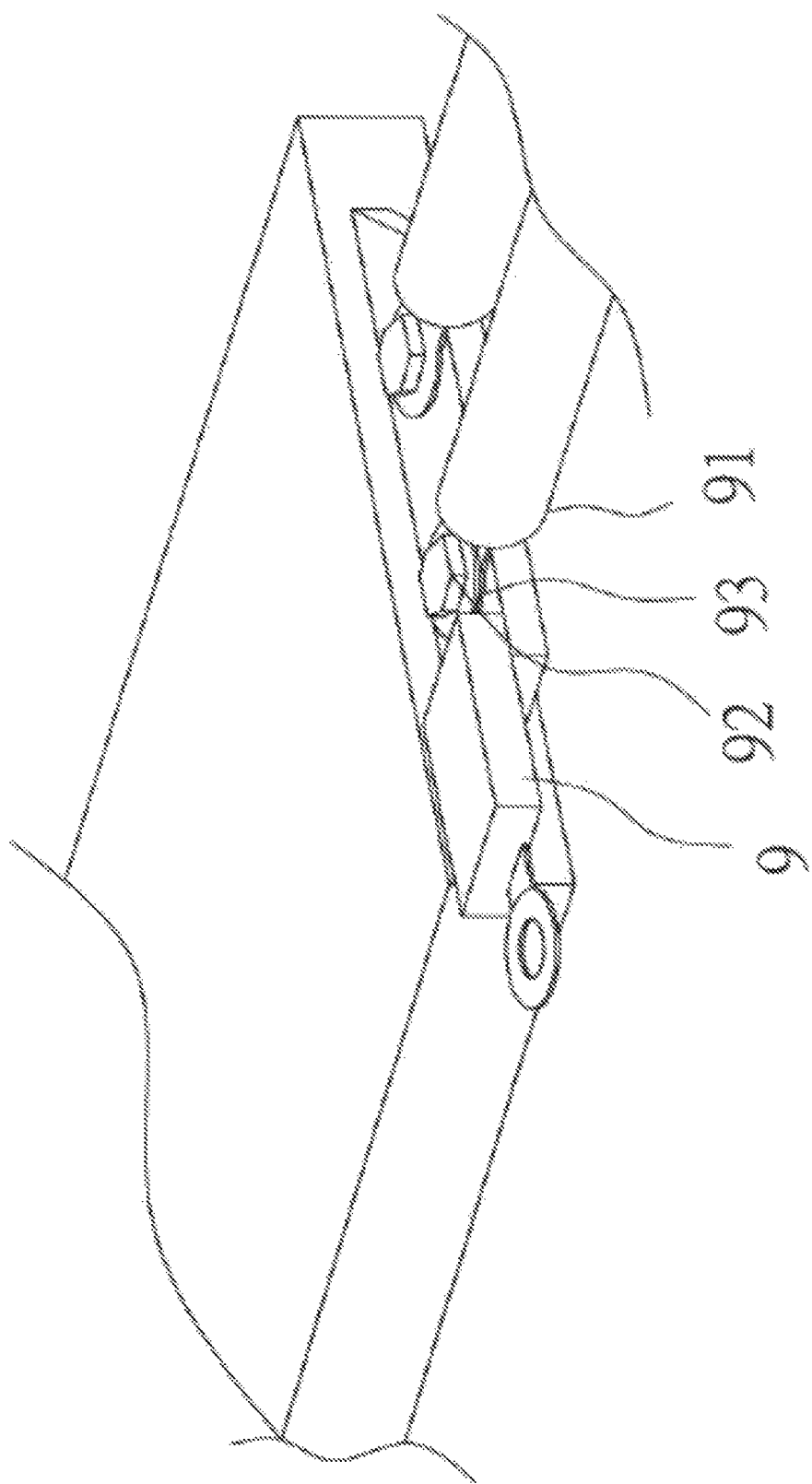
FIG. 1 shows a prior art perspective view, which illustrates a motor control device having a shunt resistor bolted along with a wire to an input port.
Figure 2:
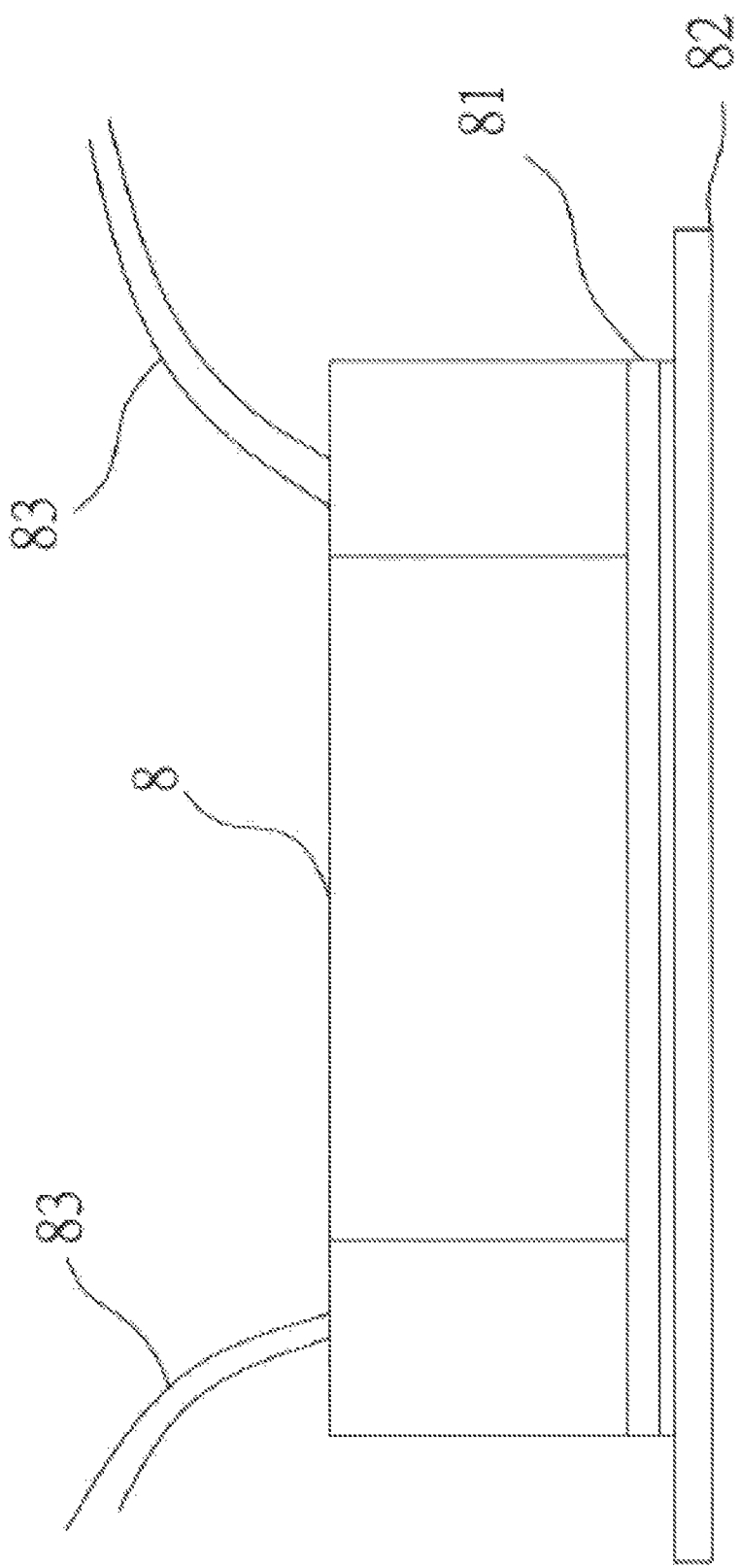
FIG. 2 shows another prior art cross-sectioned view, which illustrates the relative positions of the shunt resistor and the high-thermally conductive substrate.
Figure 3:
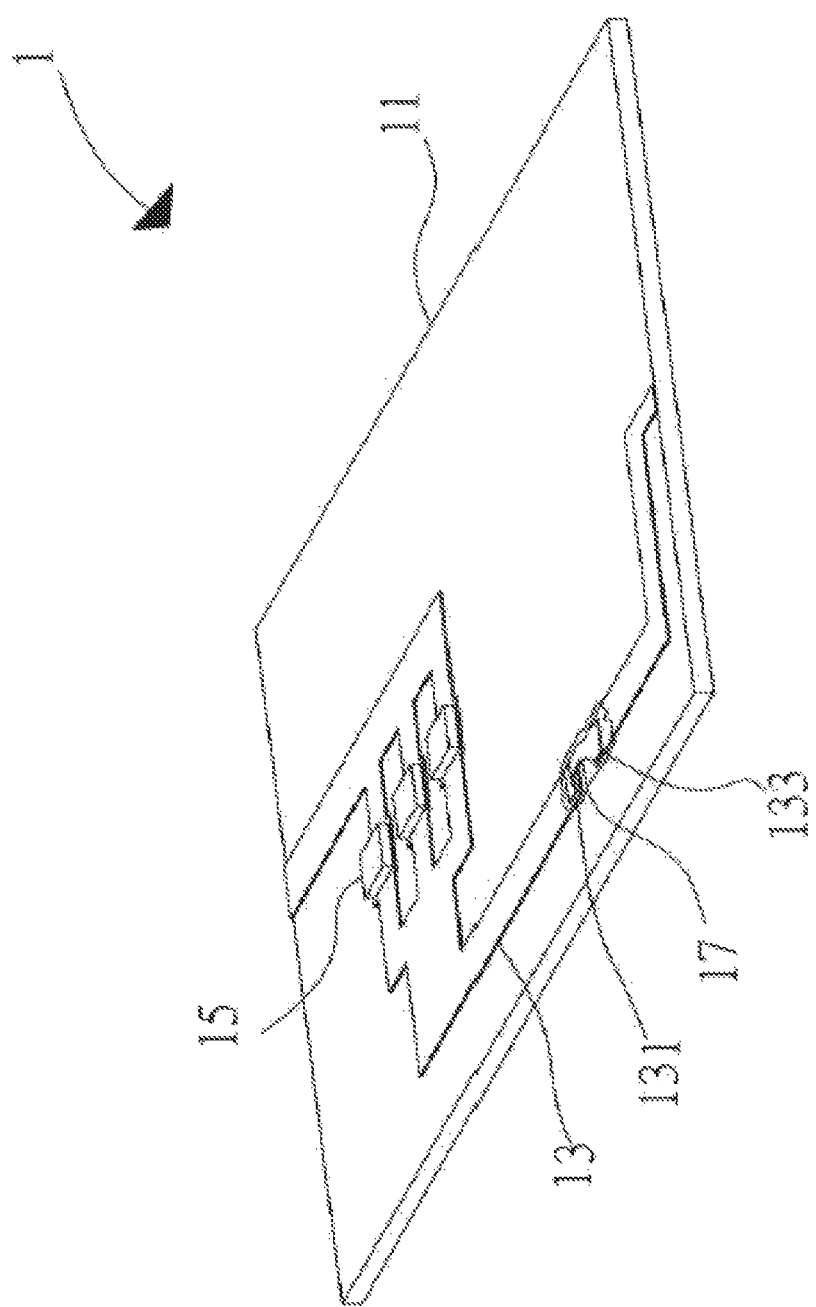
FIG. 3 shows a perspective view of a first preferred embodiment according to the present invention, which illustrates the general structure of a motor control device with built-in shunt resistor and power transistor.

The aforementioned and other technical contents, aspects and effects in relation with the present invention can be clearly appreciated through the detailed descriptions concerning the preferred embodiments of the present invention in conjunction with the appended drawings; moreover, in each embodiment, the same components will be denoted with similar numbers.

A first preferred embodiment for the motor control device with built-in shunt resistor and power transistor according to the present invention is provided, which is a type of motor control device suitable for light-weighted hybrid cars and can be connected to 48V vehicle AC motor and 48V lithium battery, for example, at the same time. The structure thereof will be described hereunder with reference to FIGS. 3 to 6 conjunctively. It can be seen that the general structure of the motor control device 1 with built-in shunt resistor and power transistor comprises a high-thermally conductive substrate 11, an electrically conductive circuit 13, plural high power transistors 15 and a shunt resistor 17.

The present embodiment will be described from the high-thermally conductive substrate 11 at the lowest layer then sequentially going up. The motor control device 1 having the built-in shunt resistor and the power transistor is configured with a type of Direct Plate Copper (DPC) substrate as its basic structure. In this basic structure, the lowest high-thermally conductive substrate 11 is made of a ceramic material of $Al_2O_3$, and since $Al_2O_3$ exhibits a thermal conductivity of at least 10 W/m·k as well as a thermal expansion coefficient of smaller than $10\times10^{-6}$/K, thermal energy can dissipate to the surrounding air more quickly than conventional PCB substrates. Moreover, its magnitude of deformation is also smaller relative to the PCB substrate. Subsequently, a plurality of electrically conductive circuits 13 having a thickness of approximately 200 μm are formed in a film form on the high-thermally conductive substrate 11, wherein the electrically conductive circuit 13 individually has a first thermal connection pad portion 131 and a second thermal connection pad portion 133 mutually spaced apart to enable the corresponding disposition of the shunt resistor 17. Besides, in addition to the Direct Plate Copper (DPC) substrate as previously explained, those skilled ones in the art can conveniently design other kinds of Ceramic substrate with conductive circuits, including, e.g., Low Temperature Co-fired Ceramic (LTCC), High Temperature Co-fired Ceramic (HTCC), Direct Bonded Copper substrate (DBC), Direct Bonded Aluminum substrate (DBA), Active Metal Bonded (AMB) copper ceramic substrate, etc., all of which can equivalently replace the aforementioned Direct Plate Copper substrate for implementations.

Figure 4:
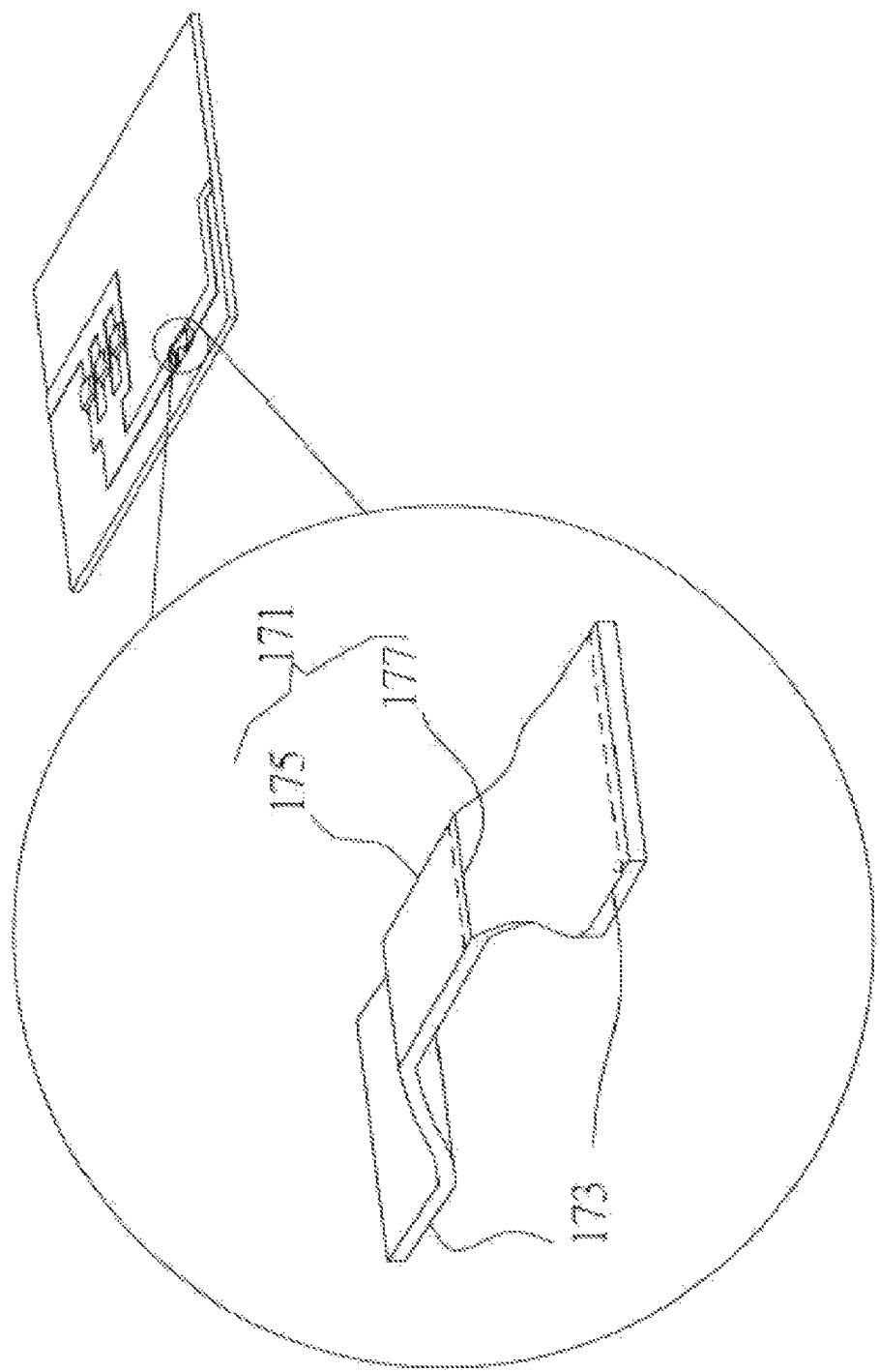
FIG. 4 shows a partially enlarged view of the embodiment described in FIG. 3, which illustrates the structure of the shunt resistor.

The high power transistor 15 exemplified as an IGBT and the shunt resistor 17 conductively connected to the high power transistor 15 are both installed on the electrically conductive circuit 13. Herein, as shown in FIG. 4, a shunt resistor 17 made of manganese-copper metal has a body 171 as an impedance structure, and the welding portions 173 extend from the body 171 for correspondingly connecting to the first thermal connection pad portion 131 and the second thermal connection pad portion 133. Microscopically, the body 171 exhibits a structure having two length side edges 175 and width side edges 177 that engage such two length side edges 175, the width side edge 177 has a predetermined width, and the welding portion 173 is formed by extending outwards respectively from each of the two width side edges 177 of the body 171 in opposite directions such that the width of the welding portion 173 is larger than the predetermined width of the width side edge 177, as shown by the dotted arrow in FIG. 4 indicating the difference between such two widths. That is, the welding portion 173 can provide a larger soldering surface and is directly soldered to the thermal connection pads by means of, for example, surface mounting processes, which allows not only convenient combinations but also ensures stable soldering connections, thereby achieving the large-area heat conduction effect.

Figure 5:
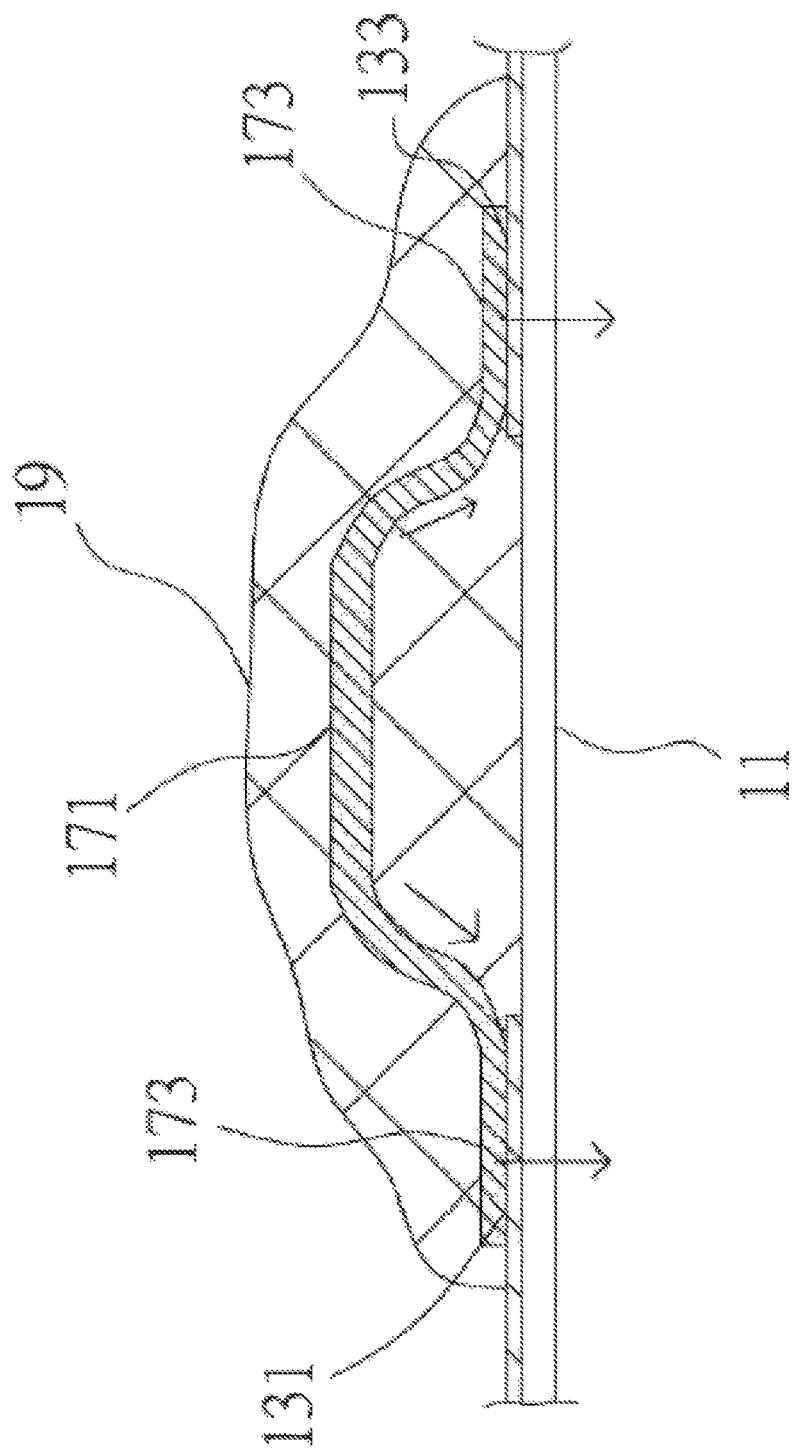
FIG. 5 shows a partially cross-sectioned view of the embodiment described in FIG. 3, which illustrates the combination method of the shunt resistor and the direction of thermal energy transfer.

Therefore, as shown in FIG. 5, when a large current flows through the shunt resistor 17, even though a large amount of thermal energy is generated and the relative thermal expansion difference and the extrusion deformation problem between the body 171 and the high-thermally conductive substrate 11 may occur, the welding portion 173 as well as the first thermal connection pad portion 131 and the second thermal connection pad portion 133 are all welded and bonded with good heat conductivity, thus further allowing the heat energy to quickly transfer to the high-thermally conductive substrate 11 by way of the welding portion 173. Meanwhile, the thermal expansion stress occurring between the body 171 and the high-thermally conductive substrate 11 due to the thermal expansion coefficient and the temperature differences can be temporarily tolerated for slightly temporary deflections because of a larger gap between the body 171 and the high-thermally conductive substrate 11, which also allows air to circulate, as illustrated by the arrow direction in FIG. 5, and can be effectively dispersed in the width direction thereby buffering the thermal stress generated by the thermal expansion. According to experiment results, when the resistivity of the welding portion is greater than $1.68\times10^{-8}$ Ωm or the thermal conductivity coefficient is above 200 W/m·k, they will demonstrate better heat dissipation efficiency.

Optionally, if the combination strength needs to be further enhanced, the welding area or boundary between the shunt resistor 17 and the welding portion 173 can be additionally protected from breaking up due to external shock or impact forces upon driving the light-duty hybrid car. It is also conceivable to further inject an underfill layer 19 between the body 171 and the high-thermally conductive substrate 11 so that the underfill layer 19 covers the body 171 and the welding portion 173 thereby improving the structural strength of the shunt resistor 17, resisting external vibrations and prolonging its service lifespan.

Figure 6:
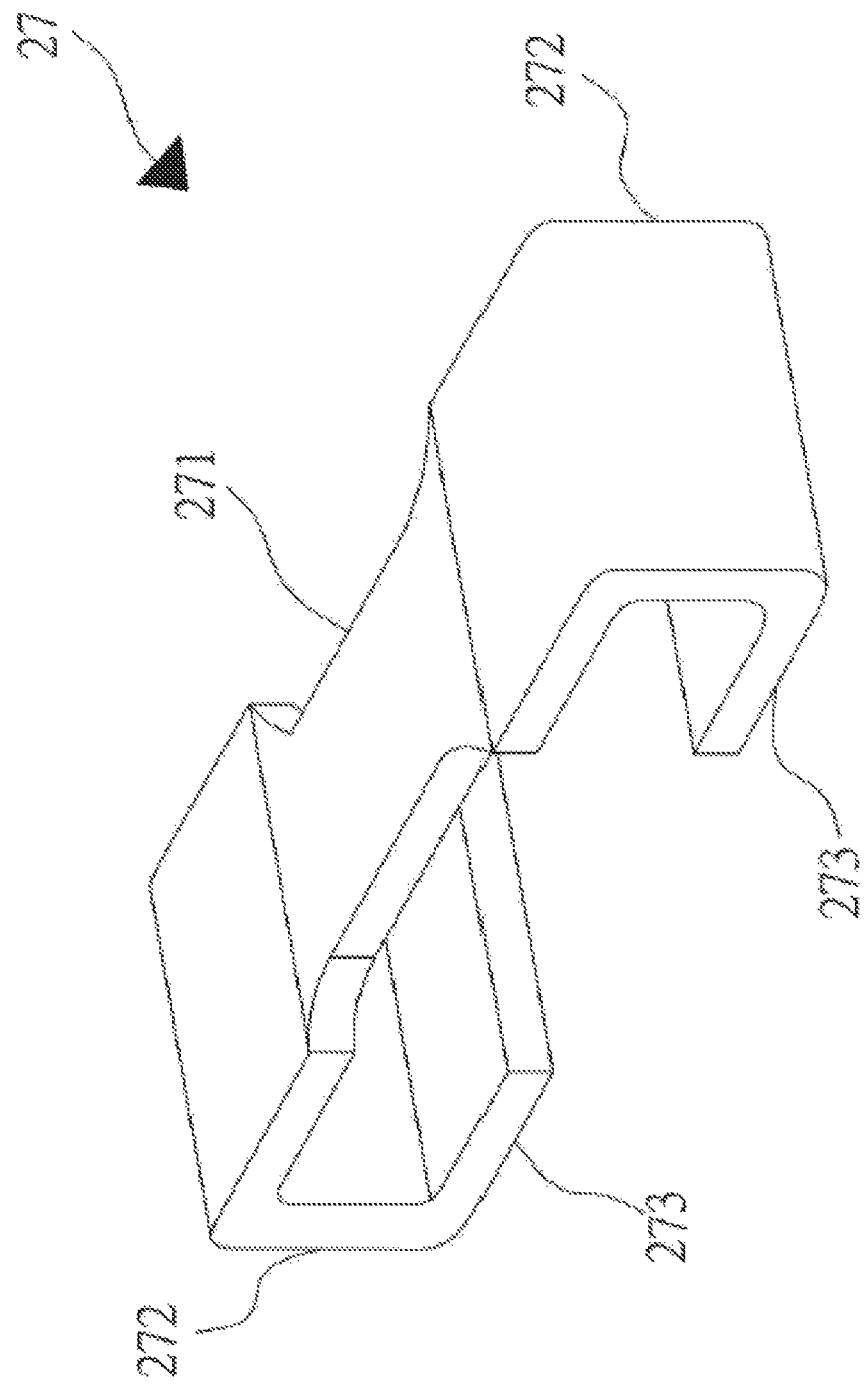
FIG. 6 shows a partial perspective view of the first embodiment according to the present invention, which illustrates a reinforced resistor enabling shock-buffering function.

It can be appreciated that, in addition to improving the structural strength of the shunt resistor by means of the aforementioned underfill layer, the enhancement on the structure of the shunt resistor can also achieve the same purpose. To distinguish from the previously described shunt resistor in terms of names, the shunt resistor of different structure explained hereunder will be referred as a reinforced resistor 27, and the structure thereof is shown in FIG. 6. It can be seen that the reinforced resistor 27 similarly comprises a body 271, but the difference exists in that a segment of elastic arm 272 first extends from the body 271, then a welding portion 273 is formed, so that the elastic arm 272 of the reinforced resistor 27 can effectively buffer and absorb shack waves. Besides, the widths of the elastic arm 272 and the welding portion 273 in the reinforcing resistor 27 are also larger than the prescribed width of the body 271, so that the thermal expansion stress can be significantly dispersed in the width direction thereby reducing the probability of damage.

After completing the combination processes of the abovesaid structures, the operations of the motor control device with built-in shunt resistor and power transistor according to the present invention will be explained as below. When the hybrid power controller of the light hybrid vehicle determines that the 48V lithium battery needs to be charged, the 48V vehicle AC motor converts the power into a high voltage AC output, and the hybrid power controller also controls the high voltage AC in order to transfer to the high power transistor of the motor control device with the built-in shunt resistor and the power transistor, so as to generate a high voltage DC through the three-phase conversion and then store in a 48V lithium battery via the shunt resistor. In the process of continuous large current transmission, it is possible to easily receive and calculate the magnitude of the current by way of the hybrid power controller connected to the two ends of the shunt resistor. Once high voltage DC currents above the rated current indeed occur, the hybrid power controller will correspondingly perform subsequent safety procedures to maintain driving safety.

Figure 7:
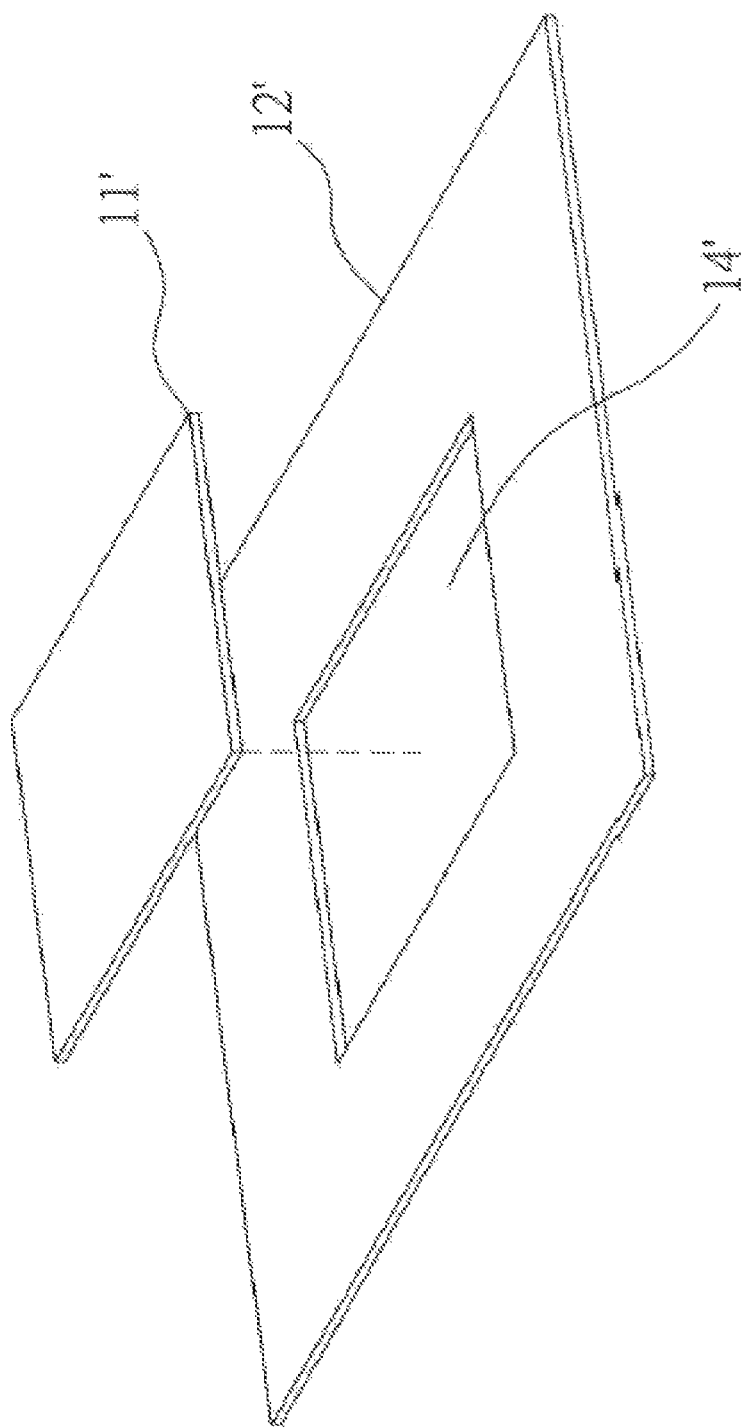
FIG. 7 shows a perspective view of a second preferred embodiment according to the present invention, which illustrates the embedment of the high-thermally conductive substrate into the PCB.
Figure 8:
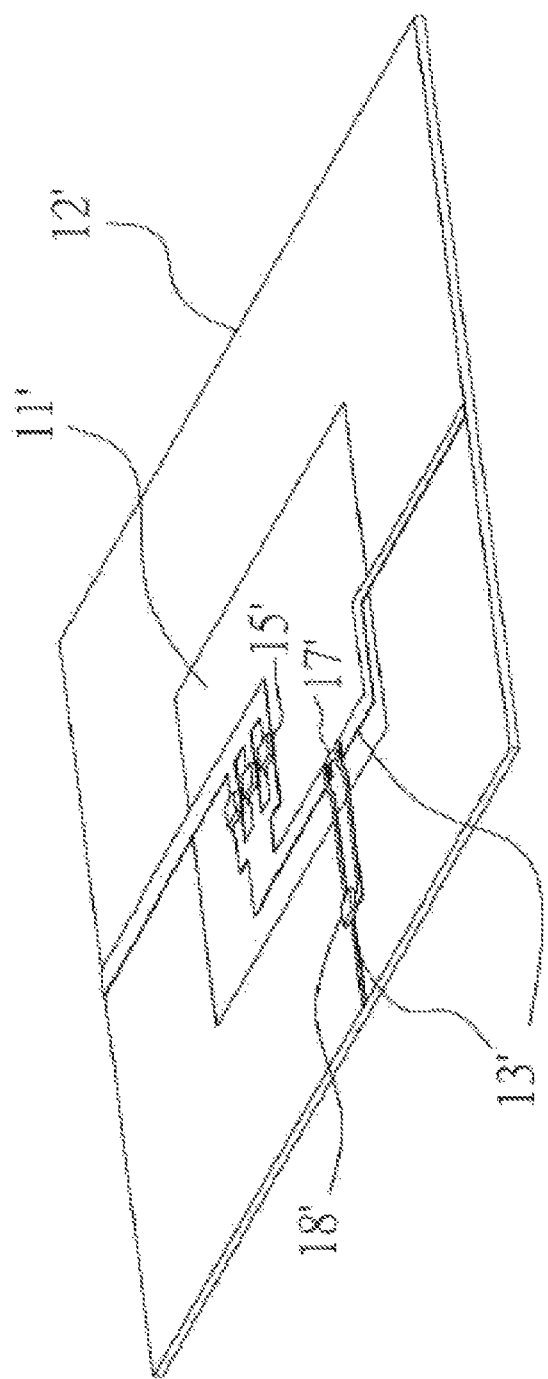
FIG. 8 shows a perspective view of the embodiment described in FIG. 7, which illustrates a motor control device with built-in shunt resistor and power transistor after completing the substrate integration.

The first preferred embodiment describes that the previous motor control device uses only one ceramic substrate as the base plate of the motor control device; in contrast, it can be seen that the control device having built-in shunt resistor and high energy consumption component of the second preferred embodiment according to the present invention applies two substrates as its base plate. Similarly, a 48V vehicle AC motor and a 48V lithium battery are taken as an example in the configuration, but since most of the control device is structurally similar to the first embodiment, such repeated details will omitted for brevity. The following descriptions will be set forth in details only on the different parts with reference to FIGS. 7 and 8.

The above-said two substrates acting as the base plate thereof are respectively exemplified as the high-thermally conductive substrate 11' of ceramic material and the PCB 12', and a hold 14' is formed in penetration on the PCB 12' in the present embodiment. Subsequently, the high-thermally conductive substrate 11' can embedded into the hole 14' such that it can be combined with the PCB 12' to constitute an integral plate, and the electrically conductive circuits 13' deployed on the high-thermally conductive substrate 11' and the PCB 12' can be conductively connected with each other. In this case, for improving the operation efficiency of the components, the high power transistor 15' and the shunt resistor 17' which are likely to generate high heat are correspondingly installed to the high-thermally conductive substrate 11'. In addition, a shunt device (not shown) demonstrating a heat generation rate much smaller than that of the high power transistor and the shunt resistor as well as a temperature sensing device 18' are correspondingly mounted on the electrically conductive circuit 13' of the PCB 12', thereby achieving the two major objectives concerning device integration and heat-sinking efficiency improvement.

Nevertheless, the aforementioned descriptions simply illustrate the preferred embodiments of the present invention, rather than limiting the scope for the implementations of the present invention thereto; hence, all effectively equivalent changes, modifications or alterations made based on the Claims as well as the contents of the specification in the present invention are deemed to be covered within the scope of the present invention.

What is claimed is:

1. A motor control device with built-in shunt resistor and power transistor, comprising:
    a high-thermally conductive substrate, whose heat transfer coefficient is at least greater than 10 W/m·k, and coefficient of thermal expansion at least smaller than $10 \times 10^{-6}$/K;
    at least one electrically conductive circuit which is thermo-conductively installed on the high-thermally conductive substrate and includes at least one first thermal connection pad portion and a second thermal connection pad portion mutually spaced apart;
    at least one high power transistor conductively connected to the electrical conductive circuit; and
    at least one shunt resistor conductively connected to the high power transistor, in which the shunt resistor respectively includes a body, as well as a pair of welding portions extending outwards individually along the mutually opposite directions from the body, and wherein the body has a prescribed width, and the width of the welding portion is not smaller than the prescribed width, and the body and the high-thermally conductive substrate are spaced apart such that, upon welding the welding portion to the first thermal connection pad portion and the second thermal connection pad portion, the thermal expansion stress occurring between the body and the high-thermally conductive substrate can be distributed and undertaken in the width direction between the welding portion and the first thermal connection pad portion and the second thermal connection pad portion.

2. The motor control device with built-in shunt resistor and power transistor according to claim 1, wherein the thermal conductivity of the thermal connection pad portion is higher than that of the high-thermally conductive substrate.

3. The motor control device with built-in shunt resistor and power transistor according to claim 1, wherein the electrically conductive circuit is selected from a set of copper or copper alloys.

4. The motor control device with built-in shunt resistor and power transistor according to claim 1, further comprising an underfill layer filled between the body and the high-thermally conductive substrate thereby buffering the motor vibration stress endured by the welding portion and the body.

5. The motor control device with built-in shunt resistor and power transistor according to claim 1, further comprising a temperature sensing device installed on the electrical conductive circuit.

6. The motor control device with built-in shunt resistor and power transistor according to claim 1, wherein the thermal conductivity coefficient of the welded portion is at least greater than 200 W/m·K.

7. The motor control device with built-in shunt resistor and power transistor according to claim 1, wherein the resistivity of the welding portion is at least greater than $1.68 \times 10^{-8}$ Ωm.

8. A control device with built-in shunt resistor and high power consumption component, comprising:
    a substrate;
    at least one electrically conductive circuit which is thermo-conductively installed on the high-thermally conductive substrate and includes at least one first thermal connection pad portion and a second thermal connection pad portion mutually spaced apart;
    at least one high power consumption component characterized in operation state variations due to current changes, which is installed on the electrically conductive circuit; and
    at least one shunt resistor conductively connected to the high power consumption component, in which the shunt resistor respectively includes a body whose thermal expansion coefficient is greater than that of the substrate, as well as a pair of welding portions extending outwards individually along the mutually opposite directions from the body, and wherein the body has a prescribed width, and the width of the welding portion is not smaller than the prescribed width, and the body and the high-thermally conductive substrate are spaced apart such that, upon welding the welding portion to the first thermal connection pad portion and the second thermal connection pad portion, the thermal expansion stress occurring between the body and the high-thermally conductive substrate can be distributed and undertaken in the width direction between the welding portion and the first thermal connection pad portion and the second thermal connection pad portion.

* * * * *